US012792500B2

(12) United States Patent
Baek et al.

(10) Patent No.: US 12,792,500 B2
(45) Date of Patent: Nov. 10, 2026

(54) MEMORY MODULE AND METHOD OF OPERATING THE SAME

(71) Applicant: SAMSUNG ELECTRONICS CO., LTD., Suwon-si (KR)

(72) Inventors: Jinhyeok Baek, Suwon-si (KR); Janghoo Kim, Suwon-si (KR); Yoochang Sung, Suwon-si (KR); Jaewoo Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 28 days.

(21) Appl. No.: 18/898,143

(22) Filed: Sep. 26, 2024

(65) Prior Publication Data

US 2025/0225067 A1 Jul. 10, 2025

(30) Foreign Application Priority Data

Jan. 9, 2024 (KR) ........................ 10-2024-0003363
May 9, 2024 (KR) ........................ 10-2024-0060936

(51) Int. Cl.
*G06F 12/02* (2006.01)
*G11C 11/4093* (2006.01)
*H03F 3/45* (2006.01)

(52) U.S. Cl.
CPC ...... *G06F 12/0223* (2013.01); *G11C 11/4093* (2013.01); *H03F 3/45269* (2013.01); *H03F 2200/129* (2013.01); *H03F 2200/165* (2013.01); *H03F 2200/267* (2013.01)

(58) Field of Classification Search
CPC ............. G06F 12/0223; G11C 11/4093; G11C 11/4074; G11C 11/4087; H03F 3/45269; H03F 2200/129; H03F 2200/165; H03F 2200/267; H03F 3/45192; H03F 2203/7236; H03F 3/72
See application file for complete search history.

(56) References Cited

U.S. PATENT DOCUMENTS

| | | | | |
|---|---|---|---|---|
| 6,771,124 | B1 | 8/2004 | Ezell | |
| 7,271,623 | B2 | 9/2007 | Palmer | |
| 7,683,720 | B1 | 3/2010 | Yehui et al. | |
| 8,941,440 | B2 | 1/2015 | Tanaka et al. | |
| 10,014,036 | B1 | 7/2018 | Zhou et al. | |
| 10,498,305 | B2 | 12/2019 | Tajalli | |
| 10,860,505 | B1 | 12/2020 | Mutnury et al. | |
| 11,075,610 | B2 | 7/2021 | Hong et al. | |
| 2006/0132191 | A1* | 6/2006 | Palmer ................. | G11C 7/1084 327/52 |
| 2024/0028531 | A1 | 1/2024 | Drew et al. | |

* cited by examiner

*Primary Examiner* — Jay W. Radke
(74) *Attorney, Agent, or Firm* — Morgan, Lewis & Bockius LLP

(57) ABSTRACT

A memory module includes a plurality of receivers commonly receiving signals. Each of the plurality of receivers includes an amplifier configured to apply a bias filtering voltage through a high-pass filter. In an enabled receiver among the plurality of receivers, a filter bias terminal connected to the high-pass filter is connected to a bias power terminal, and in a disabled receiver among the plurality of receivers, the filter bias terminal is not connected to the bias power terminal.

20 Claims, 9 Drawing Sheets

MEMORY MODULE AND METHOD OF OPERATING THE SAME

CROSS-REFERENCE TO RELATED APPLICATION(S)

This application claims priority under 35 USC 119 (a) to Korean Patent Application No. 10-2024-0003363 filed on Jan. 9, 2024 and to Korean Patent Application No. 10-2024-0060936 filed on May 9, 2024, each in the Korean Intellectual Property Office, the entire disclosures of which are incorporated by reference herein for all purposes.

FIELD

The present disclosure relates to memory modules and a methods of operating the same.

DISCUSSION

Generally, a memory module provided as low-power mobile memory may be composed of two or more ranks. In other words, in a dual-rank structure, multiple semiconductor memory devices mounted on the memory module's substrate may be classified into two ranks, and the semiconductor memory devices belonging to the same rank may be accessed simultaneously.

Ultimately, a rank refers to a unit by which a memory controller may input and output data to and from the semiconductor memory devices. As the number of ranks increases, higher-capacity memories may be configured.

SUMMARY

An embodiment provides a memory module in which a bandwidth is expanded, and a method of operating the same.

An embodiment provides a memory module in which input capacitance is reduced, and a method of operating the same.

According to an embodiment, a memory module includes a plurality of receivers commonly receiving signals. Each of the plurality of receivers includes an amplifier having a respective filter, and each amplifier is configured to selectively apply a bias filtering voltage generated by the respective filter. In an enabled receiver among the plurality of receivers, a respective filter bias terminal connected to the respective filter is selectively connected to a bias power terminal; and in a disabled receiver among the plurality of receivers, the respective filter bias terminal connected to the respective filter is selectively disconnected from the bias power terminal.

According to an embodiment, a memory module includes a first rank having first memory devices; a second rank having second memory devices; a power management chip supplying power to the first rank and the second rank; and a serial presence detection chip storing module information. Each of the first and second memory devices has at least one receiver, and the at least one receiver of each of the first and second memory devices includes an amplifier amplifying a differential input signal pair common to the first and second memory devices. When the first rank is enabled, a first filter bias terminal connected to a first high-pass filter of a first amplifier of a receiver included in the first rank is selectively connected to a bias power terminal. When the second rank is disabled, a second filter bias terminal connected to a second high-pass filter of a second amplifier of a receiver included in the second rank is selectively not connected to the bias power terminal.

According to an embodiment, a method of operating a memory module having a plurality of ranks, each rank including a respective set of at least one receiver, wherein the method includes adjusting a resistor or a capacitor of a high-pass filter within each receiver of at least one rank of the ranks, wherein each receiver of the at least one rank receives differential input signals (a respective differential signal pair) according to a channel environment; and adjusting a bias applied to the high-pass filter of each of the receivers of the at least one rank. The adjusting of the bias includes applying a bias voltage to a filter bias terminal of each of the high-pass filters included in an enabled rank among the plurality of ranks.

BRIEF DESCRIPTION OF THE DRAWINGS

The above and other embodiments of the present disclosure will be more clearly understood from the following detailed description taken in conjunction with the accompanying drawings, in which.

DETAILED DESCRIPTION

Figure 1:
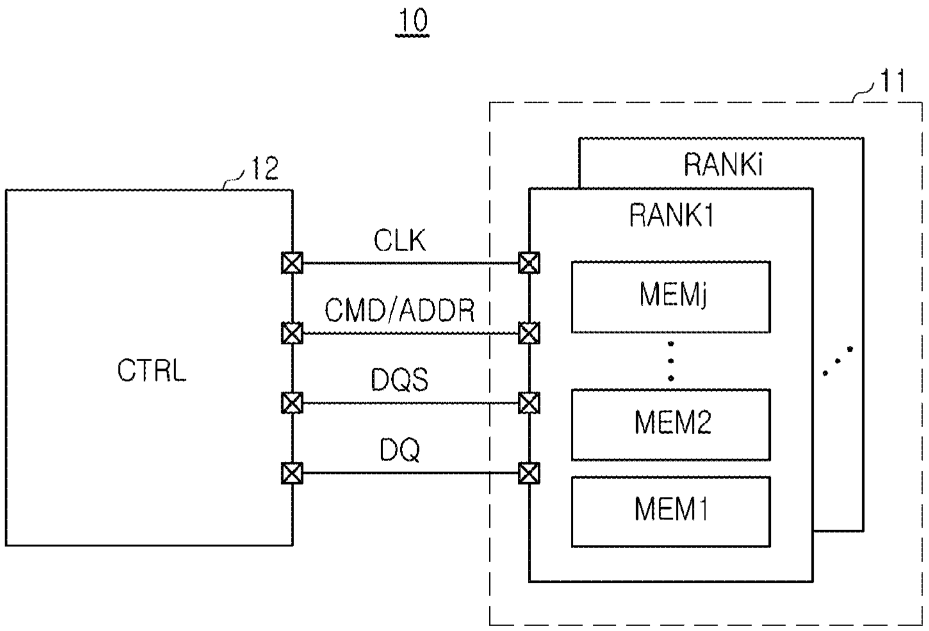
FIG. 1 is a block diagram illustrating a structure of a memory system according to an embodiment.

Hereinafter, illustrative embodiments of the present disclosure will be described by way of example with reference to the accompanying drawings.

A memory module according to an embodiment of the present disclosure may include an Alternating Current (AC) Coupled Booster (ACCB) with variable bandwidth and low input capacitance. The memory module may include an analog amplifier, a high-pass filter (HPF), a switched resistor array and voltage-controlled capacitors, and a bias on/off controller. The memory module may expand the bandwidth by substantially passing the AC component of the signal through the high-pass filter and then amplifying it. The memory module may adjust the bandwidth through the bias control of the resistor array and capacitors. The memory module may alleviate input capacitance overlap caused by the AC-coupled capacitors through bias on/off control.

In an embodiment, a memory module of the present disclosure may be applied to amplifiers of other topologies in addition to folded cascode amplifiers.

In an embodiment, the application point of the high-pass filter need not be limited to the first bias. In an embodiment, the bandwidth may be adjusted by the voltage-controlled capacitors in addition to the resistor array.

As the big data and artificial intelligence (Al) markets expand, the demand for high-density memory is increasing, leading to the application of topologies such as multi-rank and byte mode to maximize Dynamic Random-Access Memory (DRAM) capacity. As a result, signal integrity (SI) characteristics observed in the channel may deteriorate. In particular, systems like Low Power Compression Attached Memory Module (LPCAMM) have limitations in increasing the operating frequency due to channel characteristics caused by heavy loading. Therefore, an equalizer, and/or a circuit technique to compensate for input SI, may be applied to DRAM receivers.

For example, equalizing may be achieved by adding a High-pass Filter (HPF) to the differential input to filter only the AC component and applying it to a biased transistor used as a current source. The bandwidth may be expanded by the complementary operation of the main input transistor and the transistor of the current source connected to the HPF. However, to adapt to various channel environments and input frequencies with a single DRAM chip, the frequency response characteristics of the HPF may need to be adjusted. The present disclosure may adjust the frequency response by controlling the resistors and capacitors. Hence, the present disclosure offers flexible means of adjustment.

Additionally, the capacitors configuring the HPF may act as input loading in a multi-rank environment, degrading SI quality. The present disclosure adds a bias control to make the HPF capacitance of deactivated other rank DRAMs invisible as input loading.

By substantially passing the AC component of the input signal through the HPF connected to both differential amplifier inputs and then amplifying it, the bandwidth of the amplifier may be expanded. To adapt to various channel environments, the resistors and capacitors configuring the HPF may be adjustable. In the memory module, a bias control section may be added to minimize the increase in input capacitance caused by deactivated DRAMs. For example, it may have a bias level for the buffer when activated, and high impedance (Hi-Z) when deactivated.

FIG. 1 illustrates the structure of a memory system according to an embodiment. Referring to FIG. 1, a memory system 10 may include a memory module 11 and a controller 12.

The memory system 10 may be implemented to be included in a personal computer (PC) or in a mobile device. For example, the mobile device may be implemented as a laptop computer, a mobile phone, a smartphone, a tablet PC, a Personal Digital Assistant (PDA), an Enterprise Digital Assistant (EDA), a digital still camera, a digital video camera, a Portable Multimedia Player (PMP), a Personal Navigation Device or Portable Navigation Device ((PND), a handheld game console, a Mobile Internet Device (MID), a wearable computer, an Internet of Things (IoT) device, an Internet of Everything (IoE)) device, or a drone, without limitation thereto.

The memory module 11 may include a plurality of ranks RANK1 to RANKi, where i is an integer of 2 or more. Each of the plurality of ranks RANK1 to RANKi may include a plurality of memory devices MEM1 to MEMj, where j is an integer of 2 or more. Each of the memory ranks RANK1 to RANKi refers to a number of memory devices and/or memory chips that receive and respond to commands and/or addresses from the controller 12.

Each of the memory devices MEM1 to MEMj may include a memory cell array including a plurality of memory cells. In an embodiment, the memory cell may be a volatile memory cell. For example, the memory device may be a Dynamic Random-Access Memory (DRAM), a Static Random-Access Memory (SRAM), a mobile DRAM, a Double Data Rate Synchronous Dynamic Random-Access Memory (DDR SDRAM), a Low Power DDR (LPDDR) SDRAM, a Graphic DDR (GDDR) SDRAM, a Rambus Dynamic Random-Access Memory (RDRAM), or the like.

In an embodiment, the memory cell may be a non-volatile memory cell. For example, the memory device may be a non-volatile memory, such as an Electrically Erasable Programmable Read-Only Memory (EEPROM), a flash memory, a Phase Change Random-Access Memory (PRAM), a Resistance Random-Access Memory (RRAM), a Nano Floating Gate Memory (NFGM), a Polymer Random-Access Memory (PoRAM), a Magnetic Random-Access Memory (MRAM), a Ferroelectric Random-Access Memory (FRAM), or the like. Below, the memory device is described as being DRAM, but it shall be understood that the memory device is not limited thereto.

A rank generally refers to a plurality of memory devices and/or chips that all receive and respond to common commands from an associated memory controller and/or control unit. As illustrated in FIG. 1, each of the ranks RANK1 to RANKi includes a plurality of memory devices MEM1 to MEMj connected in parallel. The memory devices MEM1 to MEMj share a data (DQ) bus, a data strobe signal (DQS) bus, a command/address (CMD/ADDR) bus, and a clock signal (CLK) line. Discrete devices within a rank may receive dedicated clock enable, chip select and on-die termination signals.

Additionally, each of the ranks RANK1 to RANKi has an adjustable bandwidth and may be embodied as an amplifier implemented as an AC Coupled Booster (ACCB) with low input capacitance. In an embodiment, the amplifier may vary the bandwidth of the amplifier by substantially passing the AC component of the input signal through a high-pass filter connected to both inputs of the differential amplifier. In an embodiment, the amplifier may adjust the resistors and capacitors constituting the high-pass filter to respond to various channel environments. In an embodiment, the amplifier may control bias to significantly reduce the increase in input capacitance caused by a deactivated memory device.

The controller 12 may be implemented to send commands to some or all of the memory ranks RANK1 to RANKi simultaneously. The controller 12 may be implemented to perform a write operation to write data to the memory module 11 or a read operation to read data stored in the memory module 11. The controller 12 may write data to the memory module 11 or generate commands and addresses for reading data stored in the memory module 11. The controller 12 may be at least one of a chipset for controlling the memory module 11, a system-on-chip such as a mobile application processor (AP), a Central Processing Unit (CPU), a Graphics Processing Unit (GPU), and/or a Data Processing Unit (DPU).

The memory system 10 according to an embodiment includes a memory module 12 having an amplifier implemented as an AC Coupled Booster (ACCB), and thus, bandwidth may be adjusted, and the increase in input capacitance due to deactivated memory devices may be significantly reduced.

Figure 2:
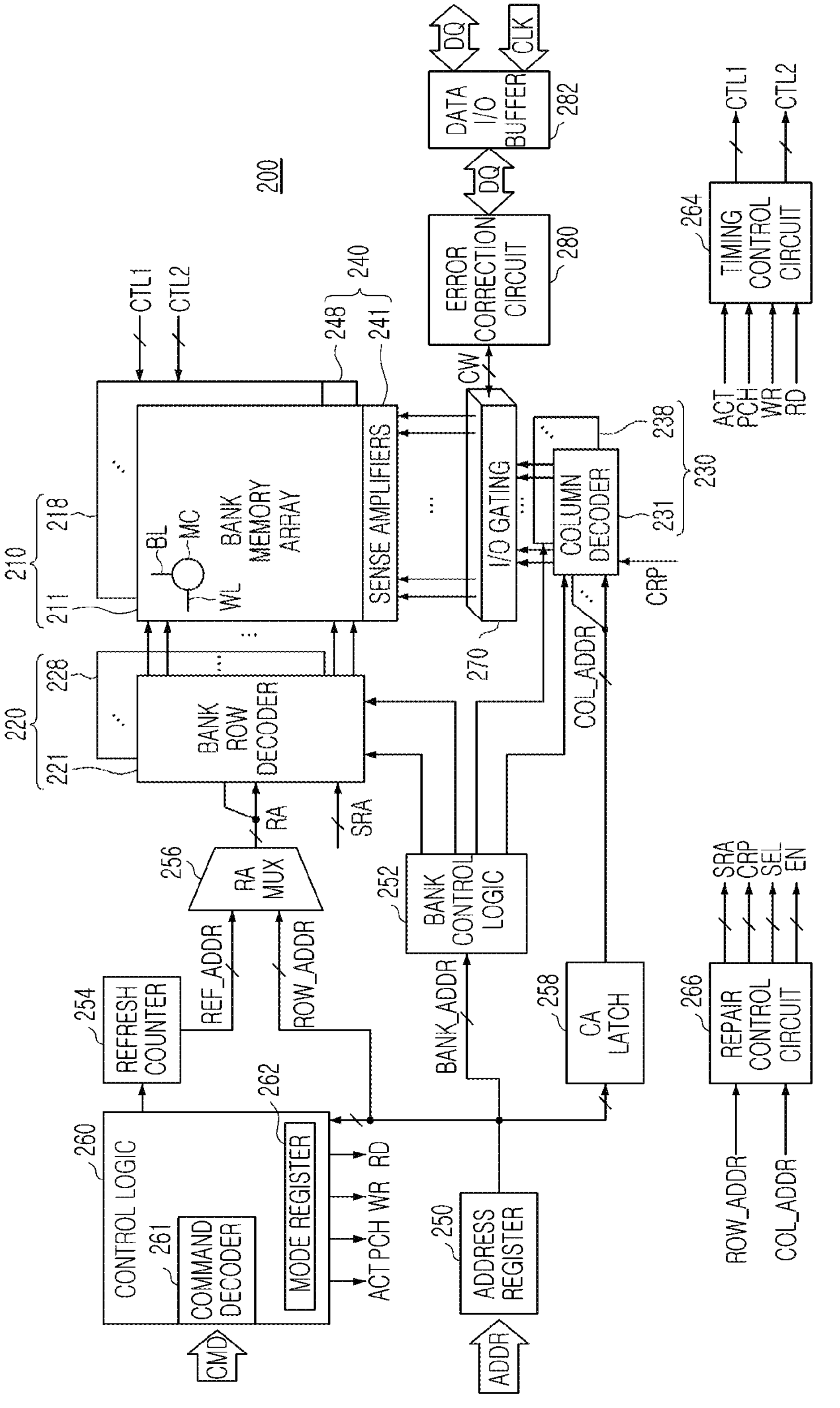
FIG. 2 is a block diagram illustrating a memory device according to an embodiment.

FIG. 2 illustrates a memory device according to an embodiment. Referring to FIG. 2, the memory device 200 may include a memory cell array 210, a row decoder 220, a column decoder 230, a sense amplification circuit 240, an address register 250, bank control logic 252, a refresh counter 254, a row address multiplexer 256, a column address latch 258, control logic 260, a timing control circuit 264, a repair control circuit 266, an input/output gating circuit 270, an error correction circuit 280, and a data input/output buffer 282.

The memory cell array 210 may include first to eighth bank arrays 211 to 218. Moreover, it shall be understood that the number of bank arrays constituting the memory cell array 210 is not limited thereto. The first to eighth bank arrays 211 to 218, first to eighth bank row decoders 221 to 228, first to eighth bank column decoders 231 to 238, and first to eighth banks of sense amplifiers 241 to 248 may configure 1st to 8th banks, respectively. Each of the first to eighth bank arrays 211 to 218 may include a plurality of memory cells MC formed between the word lines WL and the bit lines BL.

The row decoder 220 may include first to eighth bank row decoders 221 to 228 respectively connected to first to eighth bank arrays 211 to 218. In an embodiment, each of the first to eighth bank row decoders 221 to 228 may be configured to perform a repair operation using an address swap function. In an embodiment, the bank row decoder activated by the bank control logic 252 among the first to eighth bank row decoders 221 to 228 decodes the row address RA output from the row address multiplexer 256, and may activate the word line corresponding to each row address. For example, an enabled bank row decoder may apply a word line driving voltage to a word line corresponding to a row address. Additionally, the enabled bank row decoder activates the word line corresponding to the row address, and simultaneously therewith, may activate a redundancy word line corresponding to the spare row address (SRA, or 'redundancy row address') output from the repair control circuit 266.

The column decoder 230 may include first to eighth bank column decoders 231 to 238 respectively connected to the first to eighth bank arrays 211 to 218. In an embodiment, among the first to eighth bank column decoders 231 to 238, the bank column decoder activated by the bank control logic 252 may activate sense amplification corresponding to the bank address BANK_ADDR and column address COL_ADDR through the input/output gating circuit 270. Additionally, the enabled bank column decoder may perform a column repair operation in response to the column repair signal CRP output from the repair control circuit 266.

The sense amplification circuit 240 may include first to eighth bank sense amplifiers 241 to 248 respectively connected to the first to eighth bank arrays 211 to 218.

The address register 250 may receive and store an address ADDR having a bank address BANK_ADDR, a row address ROW_ADDR, and a column address COL_ADDR from an external memory controller, such as the memory controller 12 of FIG. 1 without limitation thereto. The address register 250 provides the received bank address BANK_ADDR to the bank control logic 252 and the received row address ROW_ADDR to the row address multiplexer 256, and may provide the received column address COL_ADDR to the column address latch 258. In an alternate embodiment, the address register 250 may provide the received column address COL_ADDR to the column decoder 230 when not operating in a burst mode.

The bank control logic 252 may generate bank control signals in response to the bank address BANK_ADDR. In response to some bank control signals, a bank row decoder corresponding to the bank address BANK_ADDR among the first to eighth bank row decoders 221 to 228 may be activated. In response to other bank control signals, a bank column decoder corresponding to the bank address BANK_ADDR among the first to eighth bank column decoders 231 to 238 may be activated.

The row address multiplexer 256 may receive a row address ROW_ADDR from the address register 250 and a refresh row address REF_ADDR from the refresh counter 254. The row address multiplexer 256 may selectively output a row address ROW_ADDR or a refresh row address REF_ADDR as a row address RA. The row address RA output from the row address multiplexer 256 may be applied to the first to eighth bank row decoders 221 to 228, respectively.

The column address latch 258 may receive the column address COL_ADDR from the address register 250 and temporarily store the received column address COL_ADDR. Additionally, the column address latch 258 may gradually increase the received column address COL_ADDR in a burst mode. The column address latch 258 may apply a temporarily stored or gradually increased column address COL_ADDR to the first to eighth bank column decoders 231 to 238, respectively.

The control logic circuit 260 may be implemented to control the operation of the memory device 200. For example, the control logic circuit 260 may generate control signals so that the semiconductor memory device 200 performs a write operation or a read operation. The control logic circuit 260 may include a command decoder 261 for decoding a command CMD received from the external memory controller and a mode register 262 for setting the operational mode of the memory device 200. For example, the command decoder 261 may decode a write enable signal/WE, a row address strobe signal/RAS, a column address strobe signal/CAS, a chip select signal/CS, and the like, thereby generating operational control signals corresponding to commands CMD. The generated operational control signals may include an active signal ACT, a precharge signal PCH, a write signal WR, and a read signal RD, without limitation thereto.

The control logic circuit 260 may provide the operational control signals ACT, PCH, WE and RD to the timing control circuit 264. The timing control circuit 264 may generate first control signals CTL1 controlling the voltage level of the word line WL and second control signals CTL2 controlling the voltage level of the bit line BL, in response to the operational control signals ACT, PCH, WR and RD, and may provide the generated first control signals CTL1 and second control signals CTL2 to the memory cell array 210.

The repair control circuit 266 may generate repair control signals that control repair operations of a first cell area and a second cell area of at least one of the bank arrays, based on the fuse information of each word line, the row address ROW_ADDR and column address COL_ADDR of the address ADDR (or access address). The generated repair control signals may include a spare row address SRA (or redundancy row address) for provision to the corresponding bank row decoder, a column repair signal CRP for provision to the corresponding bank column decoder, a selection signal SEL and an enable signal EN for provision to the block control circuit related to the corresponding spare array block (or redundancy array block). The repair control circuit 266 may vary the repair unit based on the address ADDR and fuse information. For example, the repair control circuit 266 may change the type and number of repair address bits using address ADDR and fuse information.

Each of multiple input/output gates of the input/output gating circuit 270 may include input data mask logic, read data latches for storing data output from the first to eighth bank arrays 211 to 228, and write drivers for writing data to the first to eighth bank arrays 211 to 218, along with circuitry gating input and/or output data.

The error correction circuit 280 may generate parity bits based on data bits of data DQ provided from the data input/output buffer 282 during a write operation, and provide a codeword CW containing data DQ and parity bits to the input/output gating circuit 270, and the input/output gating circuit 270 may write a codeword CW to the bank memory array 210. Additionally, the error correction circuit 280 may receive a codeword CW read from one bank array through the input/output gating circuit 270 during a read operation. The error correction circuit 280 performs Error Correction Code (ECC) decoding on the data DQ using the parity bits included in the read codeword CW. At least one error bit included in the data DQ may be corrected and provided to the data input/output buffer 282.

A codeword CW to be read from one of the first to eighth bank arrays 211 to 218 may be detected by a sense amplification corresponding to one bank array and stored in the read data latches of the input/output gating circuit 270. The codeword CW stored in the read data latches may be provided to the external memory controller through the data input/output buffer 282 after ECC decoding is performed by the error correction circuit 280. Data DQ written to one bank array among the first to eighth bank arrays 210 to 218 may be written to the one bank array through write drivers after performing ECC encoding in the error correction circuit 280.

In a write operation, the data input/output buffer 282 provides data DQ to the error correction circuit 280 based on the clock signal CLK provided from the external memory controller, and in a read operation, data DQ provided from the error correction circuit 280 may be provided to the external memory controller.

Moreover, in an embodiment of the present disclosure, bias control may be performed in a multi-rank system.

Figure 3:
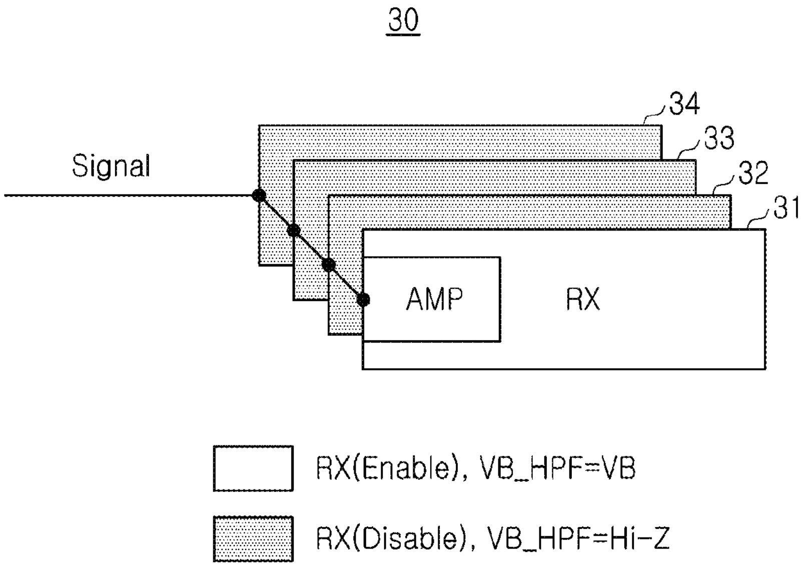
FIG. 3 is a block diagram illustrating the concept of a memory module according to an embodiment.

FIG. 3 illustrates the concept of a memory module 30 according to an embodiment. Referring to FIG. 3, the memory module 30 may include a plurality of receivers 31 to 34. In a multi-rank system, each of the plurality of receivers 31 to 34 that may be included in a corresponding rank. The signal may be shared by the plurality of receivers 31 to 34. In FIG. 3, receivers corresponding to four ranks are illustrated for convenience of explanation, but it shall be understood that the number of ranks in the present disclosure is not limited thereto.

Each of the plurality of receivers 31 to 34 may include an amplifier AMP. The amplifier AMP may vary the bias of the amplification operation depending on whether the receiver RX is enabled. In an embodiment, when the receiver RX is enabled such as when the corresponding rank is selected, the a respective filter bias terminal VB_HPF of the amplifier AMP may receive the voltage of the bias power terminal VB. And when the receiver RX is disabled such as when the corresponding rank is unselected, the the respective filter bias terminal VB HPF of the amplifier AMP may be in a high impedance state Hi-Z preventing it from receiving the voltage of the bias power terminal VB.

Figure 4:
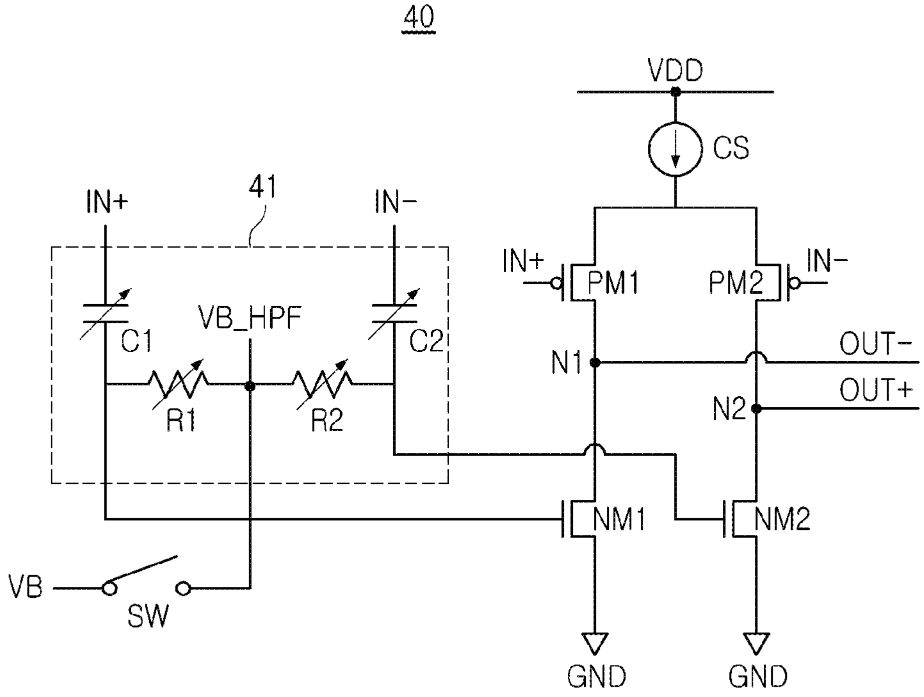
FIG. 4 is a circuit diagram illustrating an amplifier according to an embodiment by way of example.

FIG. 4 illustrates an amplifier according to an embodiment. Referring to FIG. 4, the amplifier 40 may be implemented as a common source amplifier, without limitation thereto. As illustrated in FIG. 4, the amplifier 40 may include a current source CS, P-channel Metal Oxide Semiconductor (PMOS) transistors PM1 and PM2, N-channel Metal Oxide Semiconductor (NMOS) transistors NM1 and NM2, a high-pass filter 41, and a switch SW.

The current source CS may be connected to the power terminal VDD. The current source CS may generate a common current.

The first PMOS transistor PM1 is connected between the current source CS and the first node N1 and may have a gate receiving a first input signal IN+. The first node (N1) may output a second output signal OUT−.

The second PMOS transistor PM2 is connected between the current source CS and the second node N2 and may have a gate receiving a second input signal IN−. In this case, the first input signal IN+ and the second input signal IN− are differential signals. The second node N2 may output a first output signal OUT+. In this case, the first output signal OUT+ and the second output signal OUT− are differential signals.

The first NMOS transistor NM1 is connected between the first node N1 and the ground terminal GND and may have a gate receiving a first filtering voltage. In this case, the first filtering voltage is the voltage obtained by filtering the first input signal IN+ by the high-pass filter 41.

The second NMOS transistor NM2 is connected between the second node N2 and the ground terminal GND and may have a gate receiving a second filtering voltage. In this case, the second filtering voltage is the voltage obtained by filtering the second input signal IN− by the high-pass filter 41.

The high-pass filter 41 (HPF) may include a first capacitor C1, a second capacitor C2, a first resistor R1, and a second resistor R2. In this embodiment, each of the first capacitor C1 and the second capacitor C2 may be a variable capacitor. Additionally, each of the first resistor R1 and the second resistor R2 may be a variable resistor.

The first capacitor C1 may be connected between the first input terminal receiving the first input signal IN+ and the gate of the first NMOS transistor NM1. The second capacitor C2 may be connected between the second input terminal receiving the second input signal IN− and the gate of the second NMOS transistor NM2.

The first resistor R1 may be connected between the filter bias terminal VB_HPF and the gate of the first NMOS transistor NM1. The second resistor R2 may be connected between the filter bias terminal VB_HPF and the gate of the second NMOS transistor NM2. The switch SW may be connected between the filter bias terminal VB_HPF and the bias power terminal VB.

In an embodiment, when the rank is enabled such as activated in response to a rank enable signal, the switch SW is turned on so that the filter bias terminal VB_HPF and the bias power terminal VB may be electrically connected. Accordingly, the voltage of the bias power terminal VB may be applied to the filter bias terminal VB_HPF. When the rank is disabled, the switch SW is turned off so that the filter bias terminal VB_HPF and the bias power terminal VB are electrically blocked. Accordingly, the filter bias terminal VB_HPF is in the high impedance state Hi-Z. In an embodiment, the switch SW may be implemented as a transistor.

In general, when multiple DRAM receivers are configured in a multi-rank environment, the signal integrity (SI) of the first and second inputs may be degraded by the capacitors that make up the HPF. Signal integrity is greatly affected by input capacitance. However, the capacitor of the HPF being connected multiple times by multi-rank configurations may greatly increase the input capacitance.

As illustrated in FIG. 3, bias between enabled and disabled receivers may be distinguished in a multi-rank environment of the present disclosure. The capacitor of the disabled receiver cuts off the analog biased path, to create a Hi-Z state and significantly reduce the increase in input capacitance caused by the HPF capacitor. Additionally, the increase in input capacitance may be further suppressed by combination with a voltage for capacitance adjustment of the variable capacitors C1 and C2 of FIG. 4.

As illustrated in FIG. 4, the booster of the amplifier according to an embodiment may also be applied to a basic common source amplifier. Additionally, the booster of the present disclosure may be applied to bias nodes other than or in addition to the first bias node. For example, an amplifier according to an embodiment may be implemented as a folded cascode amplifier.

Figure 5:
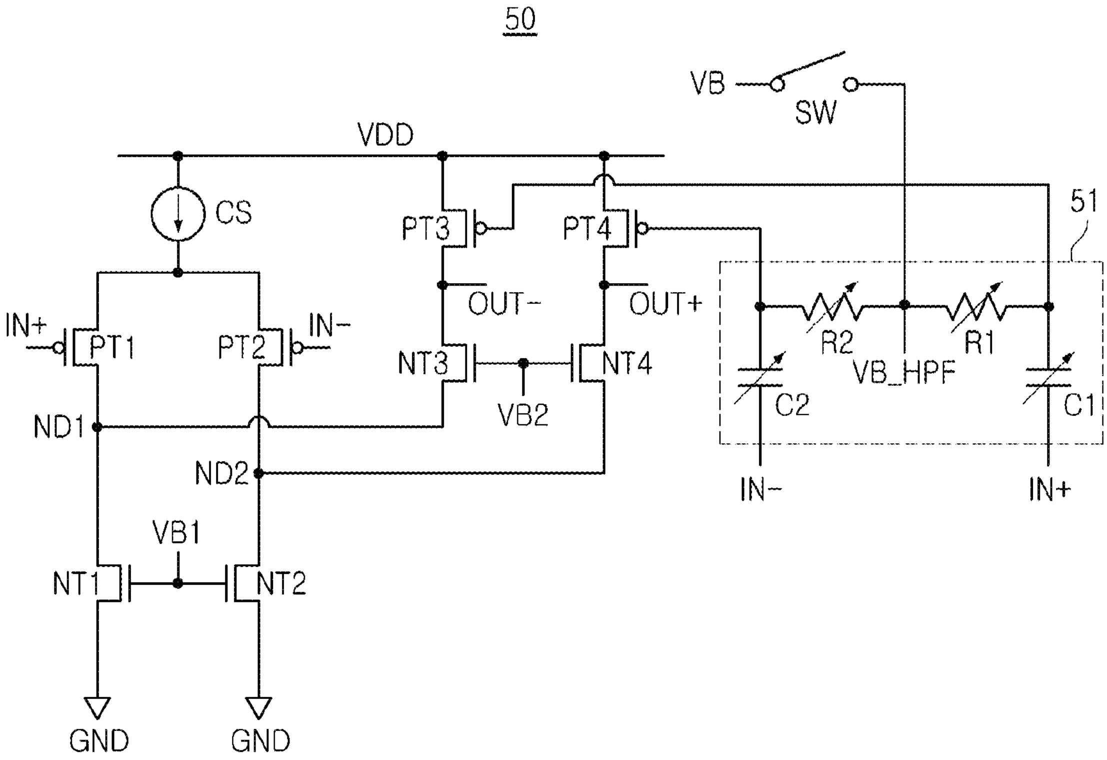
FIG. 5 is a circuit diagram illustrating an amplifier according to an embodiment by way of example.

FIG. 5 illustrates an amplifier 50 according to an embodiment. Referring to FIG. 5, the amplifier 50 may be implemented as a folded cascode amplifier. As illustrated in FIG. 5, the amplifier 50 may include a current source CS, PMOS transistors PT1 to PT4, NMOS transistors NT1 to NT4, a high-pass filter (51), and a switch SW.

The first PMOS transistor PT1 is connected between the current source CS and the first node ND1 and may have a gate receiving the first input signal IN+. The second PMOS transistor PT2 is connected between the current source CS and the second node ND2 and may have a gate receiving the second input signal IN−. The third PMOS transistor PT3 is connected between the power terminal VDD and the second output terminal and may have a gate receiving the first filtering voltage. In this case, the second output terminal may output a second output signal OUT−. Additionally, the first filtering voltage is a voltage obtained by filtering the first input signal IN+ by the high-pass filter 51. The fourth PMOS transistor PT4 is connected between the power terminal VDD and the first output terminal and may have a gate receiving the second filtering voltage. In this case, the first output terminal may output the first output signal OUT+. Additionally, the second filtering voltage is the voltage obtained by filtering the second input signal IN− by the high-pass filter 51.

The first NMOS transistor NT1 may be connected between the first node ND1 and the ground terminal GND, and may have a gate connected to the first bias terminal VB1 receiving a first bias voltage. The second NMOS transistor NT2 may be connected between the second node ND2 and the ground terminal GND, and may have a gate connected to the first bias terminal VB1 receiving the first bias voltage. The third NMOS transistor NT3 is connected between the second output terminal and the first node ND1 and may have a gate connected to the second bias terminal VB2 receiving a second bias voltage. The fourth NMOS transistor NT4 is connected between the first output terminal and the second node ND2 and may have a gate connected to the second bias terminal VB2 receiving the second bias voltage.

The high-pass filter (HPF) 51 may include a first capacitor C1, a second capacitor C2, a first resistor R1, and a second resistor R2. In an embodiment, at least one of the first capacitor C1, the second capacitor C2, the first resistor R1, and the second resistor R2 may be variably controlled.

The switch SW may be connected between the filter bias terminal VB_HPF and the bias power terminal VB. In an embodiment, when the rank is enabled, the switch SW is turned on so that the filter bias terminal VB_HPF and the bias power terminal VB may be electrically connected. Accordingly, the voltage of the bias power terminal VB may be applied to the filter bias terminal VB_HPF. In an embodiment, when the rank is disabled, the switch SW is turned off so that the filter bias terminal VB_HPF and the bias power terminal VB are electrically blocked. Accordingly, the filter bias terminal VB_HPF is in a high resistance state Hi-Z.

Moreover, in FIG. 5, integrated device technology or the like may be used to connect VB_HPF to the first bias node VB1 at the base of the structure of the Folded Cascode Amplifier and/or the second bias node VB2. However, the scope of the amplifier applicable to the present disclosure is not limited to the Folded Cascode Amplifier, and the topology of the amplifier may be expanded. From the perspective of the resistors and capacitors that make up the HPF, the bandwidth may be adjusted more flexibly by additionally borrowing a capacitor whose capacitance changes through voltage variation in a structure that adjusts the bandwidth with an existing resistor array.

Figure 6A:
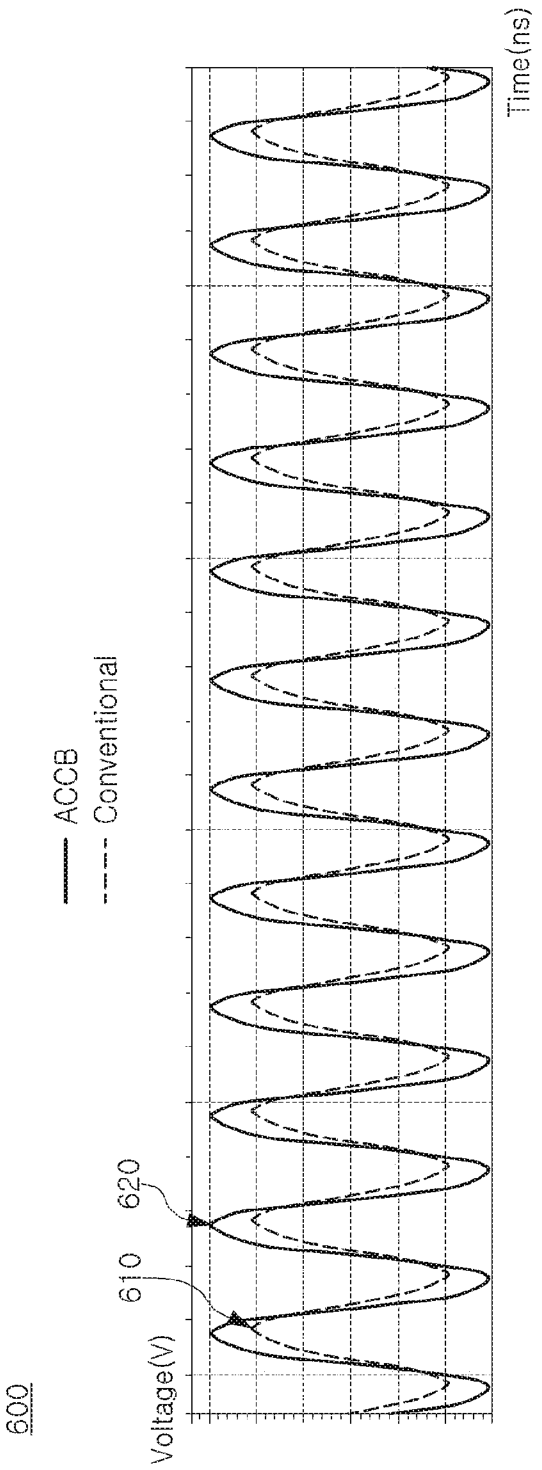
FIGS. 6A and 6B are comparative graphical diagrams illustrating simulation results of a memory module according to an embodiment by way of example.
Figure 6B:
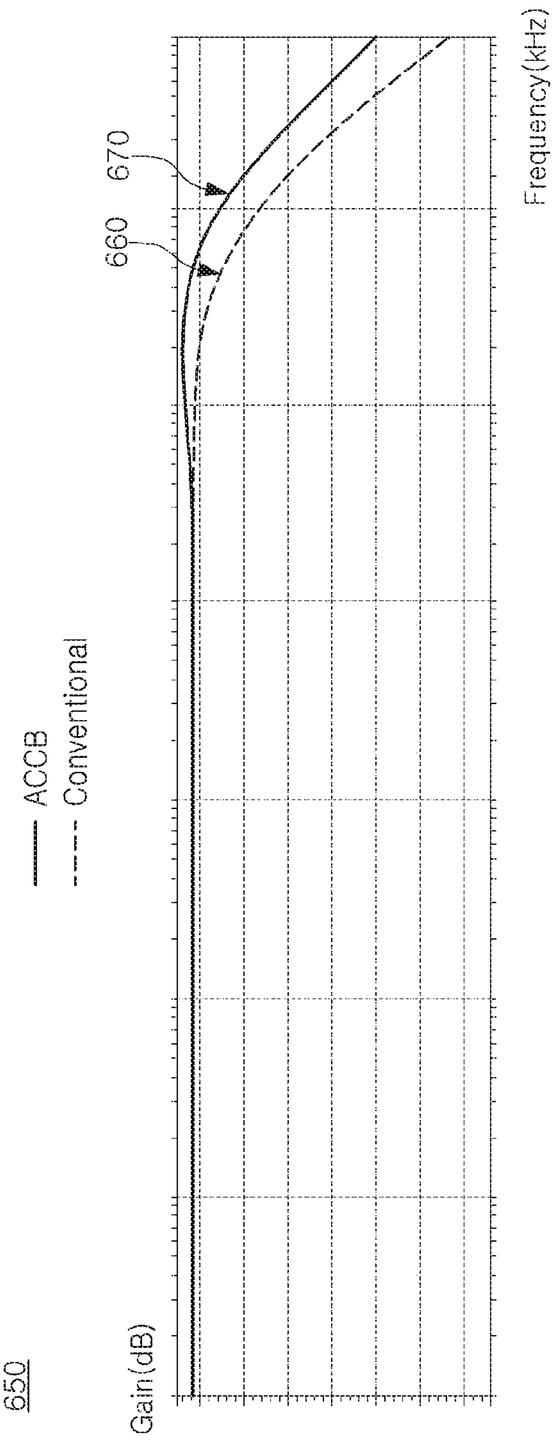

FIGS. 6A and 6B illustrate simulation results of a memory module according to an embodiment by way of example, indicated generally by the reference numerals 600 and 650, respectively. The simulation results of the effect when applying an AC Coupled Booster (ACCB) are as follows. As illustrated in FIG. 6A, the swing width of the differential output signal 610 when ACCB is not applied may be further amplified in the differential output signal 620 when ACCB is applied compared to when ACCB is not applied. As illustrated in FIG. 6B, the 3 dB bandwidth of signal 660 may be expanded such as to that of the signal 670. The 3 dB bandwidth may be adjusted by adjusting capacitance through voltage variation, without limitation thereto.

Figure 7:
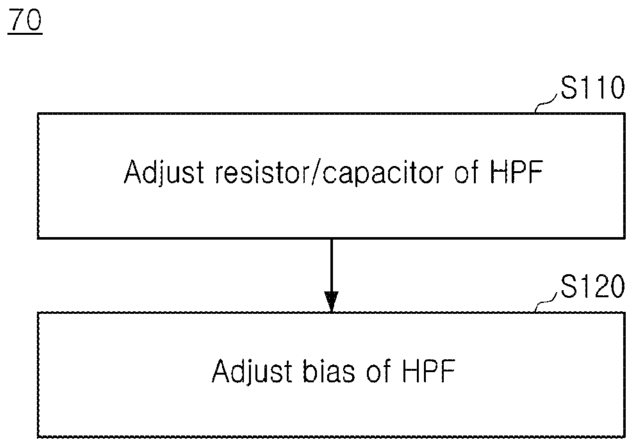
FIG. 7 is a flowchart diagram illustrating the operation of a memory module according to an embodiment by way of example.

FIG. 7 illustrates an operation of a memory module according to an embodiment as indicated generally by the reference numeral 70. Referring to FIG. 7, the operation of the memory module may be performed as follows: Depending on the channel environment, a resistor and/or capacitor of the high-pass filter (HPF) within the receiver corresponding to each of the plurality of ranks, wherein the high-pass filter receives differential input signals, may be adjusted (S110). The bias of the high-pass filter (HPF) may also be adjusted (S120). In this case, a bias voltage may be applied to a respective filter bias terminal of each high-pass filter included in an enabled rank among the plurality of ranks. In an embodiment, the bias power terminal and a respective filter bias terminal may be connected in response to the rank enable signal. In an embodiment, a respective filter bias terminal of each high-pass filter included in a disabled rank among the plurality of ranks may be disconnected from the bias power terminal and/or placed in a high impedance state. In an embodiment, one of the plurality of ranks may be enabled, and the rest of the plurality of ranks except for the one enabled rank may be disabled. In an embodiment, each of the plurality of ranks includes memory chips, and each of the memory chips may include at least one differential amplifier amplifying an input signal filtered by the high-pass filter.

Moreover, in the present disclosure, a Low Power Compression Attached Memory Module (LPCAMM) may be used.

Figure 8:
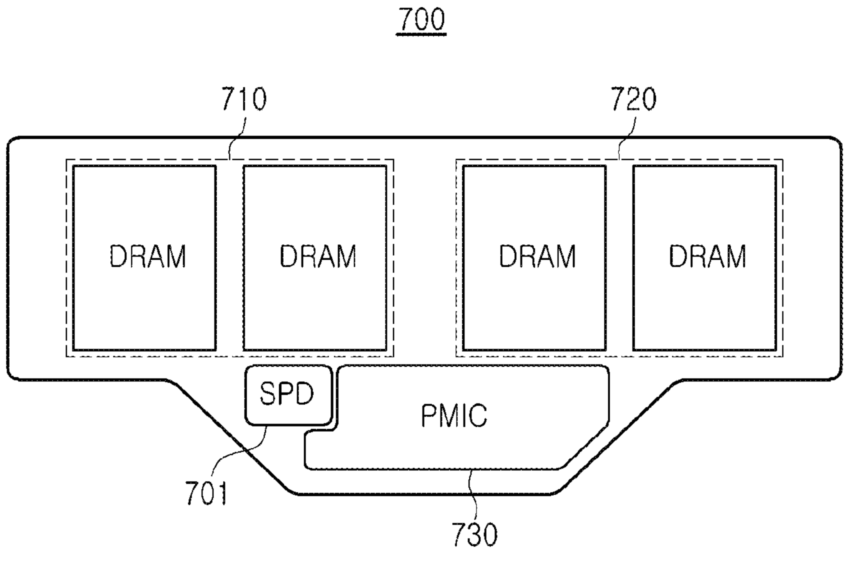
FIG. 8 is a layout diagram illustrating a memory module according to an embodiment.

FIG. 8 illustrates a memory module according to an embodiment. Referring to FIG. 8, the memory module 700 may include a serial presence detection (SPD) integrated circuit or chip 701, a first rank 710, a second rank 720, and a power management chip (PMIC) 730. Two memory channels may be included for each memory rank. Each memory channel may include two memory chips (e.g., DRAM) dedicated to storing data. In this case, it shall be understood that neither the number of ranks nor the number nor type of memory chips is limited thereto. Additionally, each of the first rank 710 and the second rank 720 may be implemented as an amplifier with a low input capacitance and an adjustable bandwidth ACCB, as described supra with respect to FIGS. 1 to 7.

The SPD chip 701 may include device information of the memory module 700. As an example, the SPD chip 701 may include initial information or device information such as module type, module configuration, storage capacity, module type, execution environment, and the like of the memory module 700.

When the memory system 700 is booted, the memory controller may read device information from the SPD chip 701 of the memory module 700 and recognize the memory module 700 based on the read device information. The memory controller may control the memory module 700 based on device information from the SPD chip 701. The PMIC chip 730 may generate a power voltage based on the input voltage and provide the generated power voltage to the memory chips. The memory chips may operate based on the power supply voltage.

Moreover, the memory module 700 may further include a Registering Clock Driver (RCD) chip. The RCD chip may control the ranks 710 and 720 and the PMIC chip 730 under the control of the memory controller. For example, the RCD chip may receive commands, addresses, clock signals, and control signals from the memory controller through the memory bus, and may perform a buffer function to distribute the received signals to the first memory channel and/or the second memory channel. The memory chips of each memory channel will exchange data with the memory controller in response to commands, addresses, clock signals, and control signals provided from the RCD chip 780.

Figure 9:
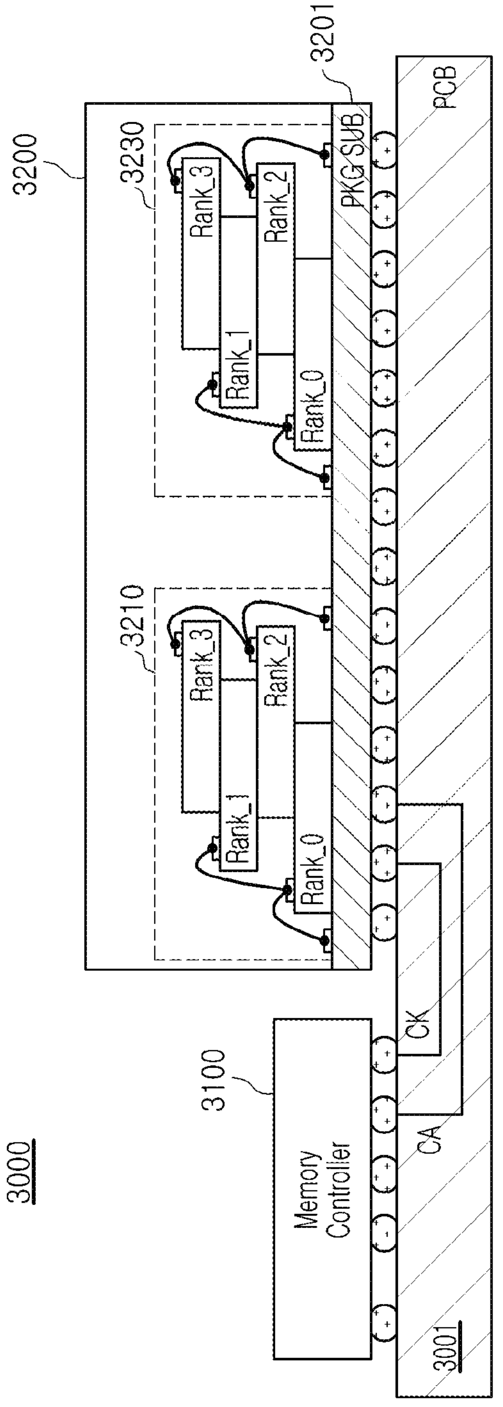
FIG. 9 is a layout diagram illustrating a memory system according to an embodiment.

FIG. 9 illustrates a memory system according to an embodiment. Referring to FIG. 9, the memory system 3000 may include a memory controller 3100 and a memory module 3200. The memory module 3200 may include multilayer memory devices 3210 and 3230 each configuring four ranks, without limitation thereto.

The memory controller 3100 may perform an access operation to write data to the memory module 3200 or read data stored in the memory module 3200. The memory controller 3100 may write data to the memory module 3200 or generate a command CMD and an address ADDR for reading data stored in the memory module 3200. The memory controller 3100 may be a chipset for controlling the memory module 3200, a system-on-chip (SoC) such as a mobile application processor (AP), a CPU, a GPU, a DPU, and/or a neural processing unit (NPU), without limitation thereto.

The memory module 3200 may include a plurality of stacked memory devices corresponding to multiple ranks (multi-ranks) Rank0, Rank1, Rank2, and Rank3. In this case, each of the multi-ranks Rank0, Rank1, Rank2, and Rank3 may be implemented as an amplifier with ACCB as described supra in FIGS. 1 to 7. The four stacked memory devices 3210 may each share a command/address signal CA and a clock signal CK in each 2-rank structure. The four stacked memory devices 3210 may be connected to the memory controller 3100 in a structure in which two ranks each constitute one channel. For example, the first rank Rank0 and the second rank Rank1 among the memory devices 3210 may be connected through wire bonding to share the command/address signal CA and the clock signal CK. Additionally, the third rank Rank2 and the fourth rank Rank3 may be interconnected through wire bonding to share the command/address signal CA and the clock signal CK. Memory devices 3230 may also be connected to the memory controller 3100 in the same rank structure as the memory devices 3210 through a PCB 3001 including signal lines for the command/address signal CA and the clock signal CK.

Moreover, the present disclosure is applicable to a High Bandwidth Memory (HBM)-Processing-in-Memory (PIM) configuration.

Figure 10:
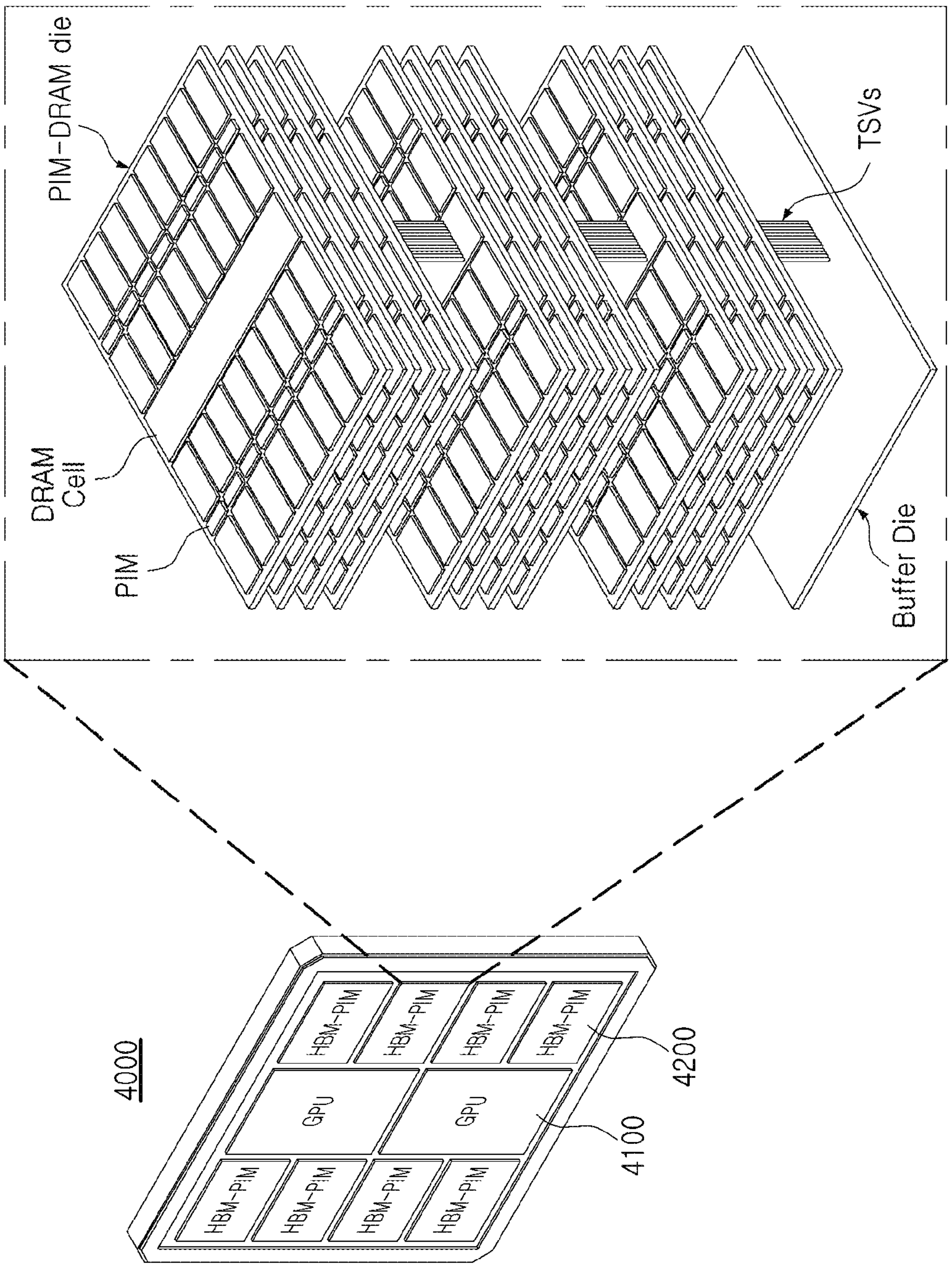
FIG. 10 is a layout diagram illustrating an on-device chip according to an embodiment.

FIG. 10 illustrates an on-device chip according to an embodiment. Referring to FIG. 10, the on-device chip 4000 may include at least one processing unit (GPU) 4100 and at least one memory device (HBM-PIM) 4200. The processing unit (GPU) 4100 may be a processor that processes data. The memory device (HBM-PIM) 4200 may be implemented to store data and/or process data. The memory device 4200 may include a buffer die and a plurality of PIM-DRAM die layers disposed above the buffer die. Each of the plurality of layers may include a DRAM cell and a Processor In Memory (PIM). In an embodiment, layers of a stacked structure may be connected to each other through respective Through Silicon Vias (TSVs). The buffer die may communicate with the processing unit 4100 and route transmission and reception signals between layers and the processing unit 4100. Furthermore, the buffer die may queue signals received from the processing unit 4100 or layers. Additionally, the buffer die may include at least one training block. The buffer die may perform training operations on layers using available training blocks.

The device described above may be implemented with hardware components, software components, and/or a combination of hardware components and software components. For example, the devices and elements described may be implemented using one or more general-purpose computers or special-purpose computers, such as a processor, a controller, an arithmetic logic unit (ALU), a digital signal processor, a microcomputer, a field programmable gate array (FPGA), a programmable logic unit (PLU), a microprocessor, or any other device capable of executing and responding to instructions. The processing device may execute an operating system (OS) and one or more software applications running on the operating system. Additionally, a processing device may access, store, manipulate, process, and generate data in response to the execution of software. For ease of understanding, one processing device may be described as being used in some cases, but those of ordinary skill in the pertinent art will appreciate that a processing device may include a plurality of processing elements or multiple types of processing elements. For example, a processing device may include a plurality of processors or one processor and one controller. Additionally, other processing configurations, such as parallel processors, may be applied in an alternate embodiment.

Software may include computer programs, code, instructions, or a combination of one or more thereof, or an external configuration device may configure the processing devices to operate as desired or command the processing devices independently or collectively. Software and/or data may be embodied in any type of machine, component, physical device, virtual equipment, computer storage medium or device, to be interpreted by the processing device and/or provide instructions or data to the processing device. Software may be distributed over networked computer systems and may be stored or executed in a distributed manner. Software and data may be stored on one or more non-transitory computer-readable recording media.

A memory module according to an embodiment may include a high-pass filter (HPF) for high frequency (HF) boosting connected to both end inputs, a resistor and/or capacitor (RC) control unit for RC control of variable resistors or capacitors within the HPF, and a control unit for adjusting the bias applied to the HPF, in a differential amplifier structure. The present disclosure may be particularly applicable to a differential amplifier structure such as a common source and/or folded cascode structure, rather than a clocked sense amplifier, without limitation thereto. In an embodiment, the memory module may add tunable RC applications to adjust the peaking of the HPF. In an embodiment, the memory module may add bias control to reduce the increase in input capacitance due to high-pass filtering in a multi-rank environment. The memory module according to an embodiment is applicable to DRAM receivers in mobile, discrete, server, and LPCAMM environments. without limitation thereto.

A memory module and operating method thereof according to an embodiment of the present disclosure may extend the bandwidth (BW) of the amplifier by substantially passing the AC component of the input signal through a high-pass filter (HPF) connected to the differential input of the differential amplifier, and then amplifying the passed signal. The memory module and the operating method may adjust the resistors and capacitors that configure the HPF to respond to various channel environments. The memory module and the operating method may add a bias control section such as for setting the buffer to the bias level when activated and/or to a high impedance state Hi-Z when deactivated, in a multi-rank system to minimize the increase in input capacitance caused by the deactivated DRAM(s). As set forth above, in a memory module and a method of operating the same according to an embodiment, a bandwidth may vary using an AC coupled booster.

In a memory module and a method of operating the same according to an embodiment, a bandwidth may be expanded after substantially passing an AC component of a signal through a high-pass filter.

In a memory module and a method of operating the same according to an embodiment, a bandwidth may be adjusted through bias control of a resistor array and a capacitor.

In a memory module and a method of operating the same according to an embodiment, input capacitance overlap caused by an AC coupled capacitor may be alleviated by using bias on/off control in a multi-rank system.

While illustrative embodiments have been shown and described, it will be apparent to those of ordinary skill in the pertinent art that modifications and variations may be made without departing from the scope and spirit of the present disclosure as defined by the appended claims.

What is claimed is:

1. A memory module comprising:

a plurality of receivers configured to commonly receive signals, wherein each of the plurality of receivers includes an amplifier having a respective filter, wherein each amplifier is configured to selectively apply a bias filtering voltage generated by the respective filter, wherein in an enabled receiver among the plurality of receivers, a respective filter bias terminal connected to the respective filter is selectively connected to a bias power terminal, and wherein in a disabled receiver among the plurality of receivers, the respective filter bias terminal connected to the respective filter is selectively disconnected from the bias power terminal.

2. The memory module of claim 1, wherein each amplifier has a switch connected between the bias power terminal and the filter bias terminal, wherein each filter comprises a high-pass filter.

3. The memory module of claim 2, wherein each of the plurality of receivers corresponds to each of ranks having a plurality of memory devices, and wherein each switch connects the bias terminal and the filter bias terminal in response to a rank enable signal activating one of the ranks.

4. The memory module of claim 1, wherein each amplifier includes a common source amplifier.

5. The memory module of claim 4, wherein each amplifier includes:

a current source connected to a power terminal;

a first PMOS transistor connected between the current source and a first node outputting a first differential output signal, and having a gate receiving a first differential input signal;

a second PMOS transistor connected between the current source and a second node outputting a second differential output signal and having a gate receiving a second differential input signal;

a first NMOS transistor connected between the first node and a ground terminal and having a gate receiving a first bias filtering voltage;

a second NMOS transistor connected between the second node and the ground terminal and having a gate receiving a second bias filtering voltage;

a high-pass filter connected to the filter bias terminal, receiving the first differential input signal and the second differential input signal, and outputting the first bias filtering voltage and the second bias filtering voltage; and a switch connecting the bias power terminal to the filter bias terminal in response to a rank enable signal.

6. The memory module of claim 5, wherein each respective filter includes:

a first capacitor connected between the first differential input signal and the gate of the first NMOS transistor;

a second capacitor connected between the second differential input signal and the gate of the second NMOS transistor;

a first resistor connected between the filter bias terminal and the gate of the first NMOS transistor; and a second resistor connected between the filter bias terminal and the gate of the second NMOS transistor.

7. The memory module of claim 1, wherein each amplifier includes a folded cascode amplifier.

8. The memory module of claim 7, wherein each amplifier includes:

a current source connected to a power terminal;

a first PMOS transistor connected between the current source and a first node, and having a gate receiving a first differential input signal;

a second PMOS transistor connected between the current source and a second node and having a gate receiving a second differential input signal;

a third PMOS transistor connected between the power terminal and a second output terminal outputting a second differential output signal and having a gate receiving a first bias filtering voltage;

a fourth PMOS transistor connected between the power terminal and a first output terminal outputting a first differential output signal, and having a gate receiving a second bias filtering voltage;

a first NMOS transistor connected between the first node and a ground terminal and having a gate connected to a first bias power terminal;

a second NMOS transistor connected between the second node and the ground terminal and having a gate connected to the first bias power terminal;

a third NMOS transistor connected between the second output terminal and the first node, and having a gate connected to a second bias power terminal;

a fourth NMOS transistor connected between the first output terminal and the second node and having a gate connected to the second bias power terminal;

a high-pass filter connected to the filter bias terminal, receiving the first differential input signal and the second differential input signal, and outputting the first bias filtering voltage and the second bias filtering voltage; and a switch connecting the bias power terminal to the filter bias terminal in response to a rank enable signal.

9. The memory module of claim 8, wherein the high-pass filter includes:

a first capacitor connected between the first differential input signal and the gate of the first NMOS transistor;

a second capacitor connected between the second differential input signal and the gate of the second NMOS transistor;

a first resistor connected between the filter bias terminal and the gate of the first NMOS transistor; and a second resistor connected between the filter bias terminal and the gate of the second NMOS transistor.

10. The memory module of claim 9, wherein each of the first capacitor and the second capacitor is a variable capacitor, and wherein each of the first resistor and the second resistor is a variable resistor.

11. A memory module comprising:

a first rank having first memory devices;

a second rank having second memory devices;

a power management chip configured to supply power voltages to the first rank and the second rank; and a serial presence detection chip configured to store module information, wherein each of the first and second memory devices has at least one receiver, wherein the at least one receiver of each of the first and second memory devices includes an amplifier amplifying differential input signals, wherein when the first rank is enabled, a first filter bias terminal connected to a first high-pass filter of a first amplifier included in the first rank is selectively connected to a bias power terminal, and wherein when the second rank is disabled, a second filter bias terminal connected to a second high-pass filter of a second amplifier included in the second rank is selectively not connected to the bias power terminal.

12. The memory module of claim 11, wherein a resistor or a capacitor of each of the first high-pass filter and the second high-pass filter is variable.

13. The memory module of claim 11, wherein a bias of each of the first high-pass filter and the second high-pass filter is adjusted.

14. The memory module of claim 11, wherein the amplifier includes:

a current source connected to a power terminal;

a first PMOS transistor connected between the current source and a first node outputting a first differential output signal, and having a gate receiving a first differential input signal;

a second PMOS transistor connected between the current source and a second node outputting a second differential output signal, and having a gate receiving a second differential input signal;

a first NMOS transistor connected between the first node and a ground terminal and having a gate receiving a first bias filtering voltage;

a second NMOS transistor connected between the second node and the ground terminal and having a gate receiving a second bias filtering voltage;

a high-pass filter connected to the filter bias terminal, receiving the first differential input signal and the second differential input signal, and outputting the first bias filtering voltage and the second bias filtering voltage; and a switch connecting the bias power terminal to the filter bias terminal in response to a rank enable signal.

15. The memory module of claim 11, wherein the amplifier includes:

a current source connected to a power terminal;

a first PMOS transistor connected between the current source and a first node, and having a gate receiving a first differential input signal;

a second PMOS transistor connected between the current source and a second node, and having a gate receiving a second differential input signal;

a third PMOS transistor connected between the power terminal and a second output terminal outputting a second differential output signal, and having a gate receiving a first bias filtering voltage;

a fourth PMOS transistor connected between the power terminal and a first output terminal outputting a first differential output signal, and having a gate receiving a second bias filtering voltage;

a first NMOS transistor connected between the first node and a ground terminal and having a gate connected to a first bias power terminal;

a second NMOS transistor connected between the second node and the ground terminal and having a gate connected to the first bias power terminal;

a third NMOS transistor connected between the second output terminal and the first node and having a gate connected to a second bias power terminal;

a fourth NMOS transistor connected between the first output terminal and the second node and having a gate connected to the second bias power terminal;

a high-pass filter connected to the filter bias terminal, receiving the first differential input signal and the second differential input signal, and outputting the first bias filtering voltage and the second bias filtering voltage; and a switch connecting the bias power terminal to the filter bias terminal in response to a rank enable signal.

16. A method of operating a memory module having a plurality of ranks, comprising:

adjusting a resistor or a capacitor of a high-pass filter within a receiver corresponding to each of the plurality of ranks according to a channel environment;

wherein the high-pass filter within the receiver receives differential input signals; and adjusting a bias applied to the high-pass filter, wherein the adjusting of the bias includes applying a bias voltage to a respective filter bias terminal of a high-pass filter included in an enabled rank among the plurality of ranks.

17. The method of claim 16, wherein the applying of the bias voltage includes connecting a bias power terminal to the respective filter bias terminal in response to a rank enable signal.

18. The method of claim 16, wherein the adjusting of the bias further includes disconnecting a respective filter bias terminal of a high-pass filter included in a disabled rank among the plurality of ranks from a bias power terminal.

19. The method of claim 16, further comprising:

activating one rank among the plurality of ranks; and deactivating ranks excepting the one rank among the plurality of ranks.

20. The method of claim 16, wherein each of the plurality of ranks includes memory chips, wherein each of the memory chips includes at least one differential amplifier amplifying an input signal input through the high-pass filter.

* * * * *